United States Patent [19]

Burton et al.

[11] Patent Number: 5,006,796
[45] Date of Patent: Apr. 9, 1991

[54] TEMPERATURE CONTROL INSTRUMENT FOR ELECTRONIC COMPONENTS UNDER TEST

[75] Inventors: David P. Burton, Parteen; Paul A. Dillon, Foxrock; Malcolm I. Stephenson, Adare, all of Ireland

[73] Assignee: Irish Transformers Limited, Limerick, Ireland

[21] Appl. No.: 263,232

[22] Filed: Oct. 27, 1988

[30] Foreign Application Priority Data

Oct. 28, 1987 [IE] Ireland ............................. 2886/87
Mar. 11, 1988 [IE] Ireland ............................. 713/88

[51] Int. Cl.⁵ .......................... G01R 31/02; F28F 7/00
[52] U.S. Cl. ................................ 324/158 F; 165/61; 165/80.3; 324/73.1
[58] Field of Search ........... 324/158 F, 73 PC, 158 P, 324/73.1; 62/3, 62; 165/61, 80.2, 80.3

[56] References Cited

U.S. PATENT DOCUMENTS

| | | | |
|---|---|---|---|
| 2,918,648 | 12/1959 | Ludman et al. | 324/158 P |
| 4,253,515 | 3/1981 | Swiatosz | 165/61 |
| 4,324,285 | 4/1982 | Henderson | 165/2 |
| 4,426,619 | 1/1984 | Demand | 324/158 F |
| 4,636,726 | 1/1987 | Santomango et al. | 324/158 F |
| 4,734,872 | 3/1988 | Eager et al. | 324/73 PC |
| 4,759,190 | 7/1988 | Trachtenberg et al. | 62/3.62 |
| 4,780,086 | 10/1988 | Jenner et al. | 324/158 F |
| 4,839,587 | 6/1989 | Flatley et al. | 324/158 F |

FOREIGN PATENT DOCUMENTS

| | | |
|---|---|---|
| 8302527 | 7/1983 | European Pat. Off. . |
| 0247927 | 2/1987 | European Pat. Off. . |
| 0240780 | 10/1987 | European Pat. Off. . |
| 2112565 | 7/1983 | United Kingdom . |
| 2180959 | 4/1987 | United Kingdom . |

OTHER PUBLICATIONS

IBM Technical Disclosure Bulletin, vol. 9, No. 3, Aug. 3, 1966.
I.E.E.E. Transactions on Nuclear Science, NS-33 (1986), Dec., No. 6, New York, N.Y., U.S.A.

Primary Examiner—Ernest F. Karlsen
Attorney, Agent, or Firm—Fleit, Jacobson, Cohn, Price, Holman & Stern.

[57] ABSTRACT

An instrument (1) for controlling the temperature of electronic components (20) under test creates a testing environment in an enclosure within which a component contacts directly the active face of a set of back-to-back Peltier cells (50). Heating and cooling of the component (20) under test is readily achieved by controlling the Peltier cells (50) and test components may be easily interchanged using a removable mounting assembly (10, 11, 12, 13). The instrument has the advantages of being small, portable, easy to operate, inexpensive to manufacture and to run, and of producing very little electrical noise.

10 Claims, 7 Drawing Sheets

TEMPERATURE CONTROL INSTRUMENT FOR ELECTRONIC COMPONENTS UNDER TEST

BACKGROUND OF THE INVENTION

1. Field of the Invention

The present invention relates to the temperature control of electronic components under test, for example, integrated circuits, printed circuits, hybrid circuits and other electronic devices, hereinafter referred to generally as electronic components.

The temperature range over which electronic components have to be tested varies depending on the particular application. For example, in high reliability applications, such as avionics and many civil and military applications it is necessary that electronic components function over the range −55° C. to +125° C. Needless to say, for many other applications there are slightly smaller temperature ranges within which components must function.

2. Description of the Prior Art

The only satisfactory way of testing such components is to provide an environment in which the component can be placed and tested. Any form of localized heating or cooling of a component under test is unsatisfactory. Accordingly, it is necessary to house the component in an enclosure within which the necessary test environment can be created. Generally, such an environment is heated by an electric heater and cooled by some form of gaseous coolant in a two-stage refrigeration system, or by a liquid coolant, for example, evaporation of liquid nitrogen in the enclosure. Unfortunately, two-stage refrigeration systems have to be used because one refrigeration unit alone is incapable of cooling over the temperature range usually required. U.S. Pat. Nos. 4,426,619 and 4,734,872 (Temptronic Corporation) describe a typical system for temperature control of components within a controlled environment in which a gaseous coolant is used. The systems of these inventions include air compressors and dryers, large refrigeration units and an electrical processing unit. Such systems are extremely bulky as a large amount of space is required for the refrigeration and electrical processing units, and for storage containers of cooling gas. As the operation of these systems is complex and much equipment is required, they are extremely expensive both to manufacture and to run. Further, in many such systems the desired accuracy is seldom achieved. Further, these systems are extremely noisy acoustically, and, indeed, a special sound insulating room is sometimes required. Another common problem is the formation of ice on the circuit being tested caused by condensation of atmospheric moisture. Such moisture can produce unwanted electrically conducting paths. Another problem is that components associated with a component under test must generally be located at a relatively large distance from the component under test. This can lead to distortion of test signals. A further problem is that change-over between tests is generally exceedingly time-consuming.

SUMMARY OF THE INVENTION

An object of the present invention is to provide a radically different temperature control instrument which does not require conventional refrigeration units with gas or liquid handling equipment associated with the prior art.

It is another object of the invention to overcome the problems of condensation associated with conventional temperature control apparatus. A further object is to provide a temperature control instrument with improved accuracy.

A still further object is to provide a temperature control instrument which is relatively simple, inexpensive and physically small, preferably portable. Another object is to allow components connected to a component under test to be located relatively close thereto, and a further object is to allow a relatively quick change-over between tests.

According to the invention, there is provided a temperature control instrument for an electronic component under test comprising:
  a test enclosure for the component;
  socket means within the enclosure for reception of the component;
  a thermoelectric device for heating or cooling the enclosure, the thermoelectric device having a heat transfer active face and a reference face, maintained at a substantially constant temperature, the temperature of the active face being altered by the controller varying the magnitude and direction of current applied to the device;
  temperature sensing means for sensing temperature within the enclosure; and
  a controller for controlling operation of the thermoelectric device.

BRIEF DESCRIPTION OF THE DRAWINGS

The invention will be more clearly understood from the following description of a preferred embodiment thereof, given by way of example only with reference to the accompanying drawings wherein.

DESCRIPTION OF THE PREFERRED EMBODIMENTS

Figure 3:
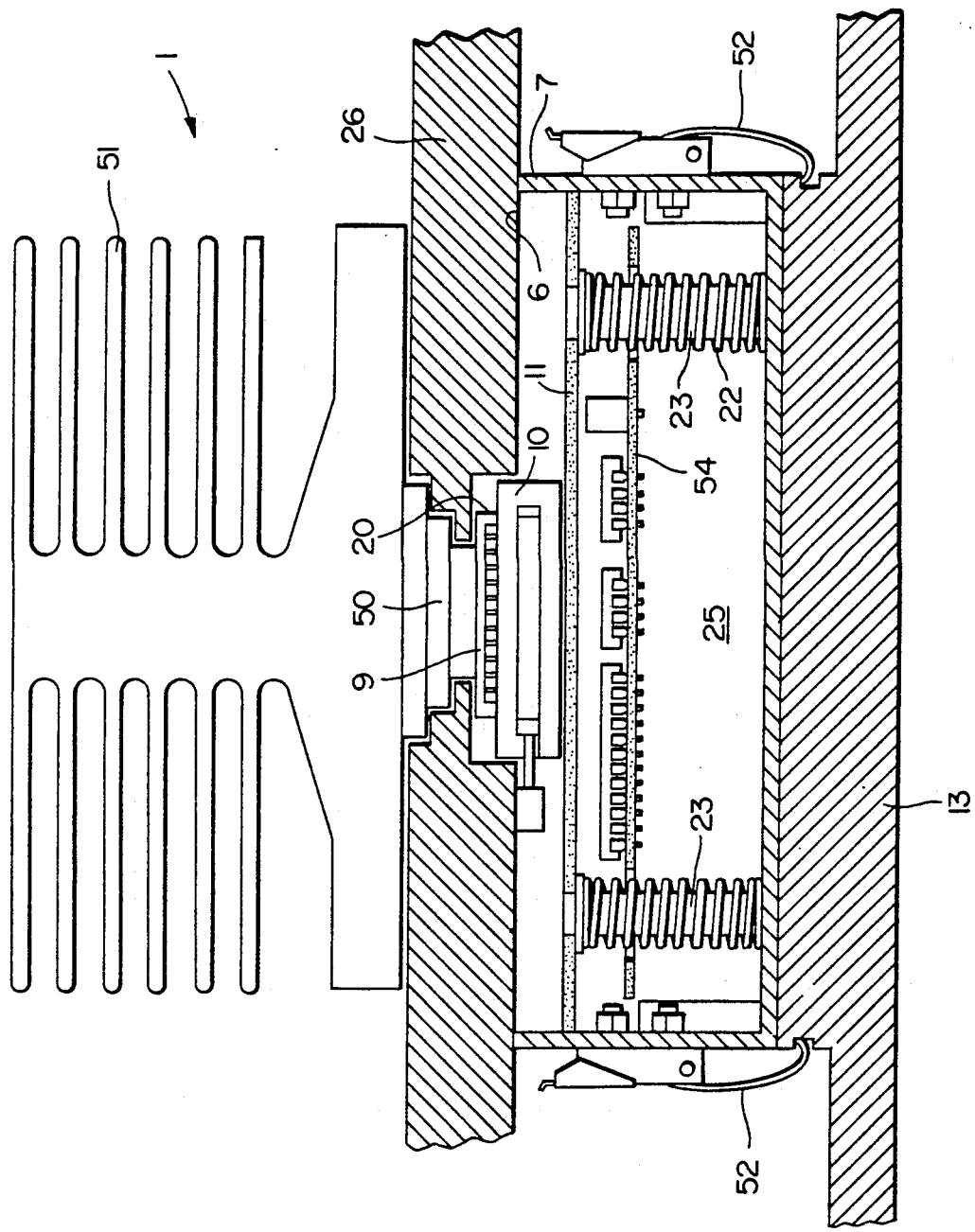
FIG. 3 is a cross-sectional view of the portion of the instrument illustrated in FIG. 2 with the enclosure in the closed portion.
Figure 4:
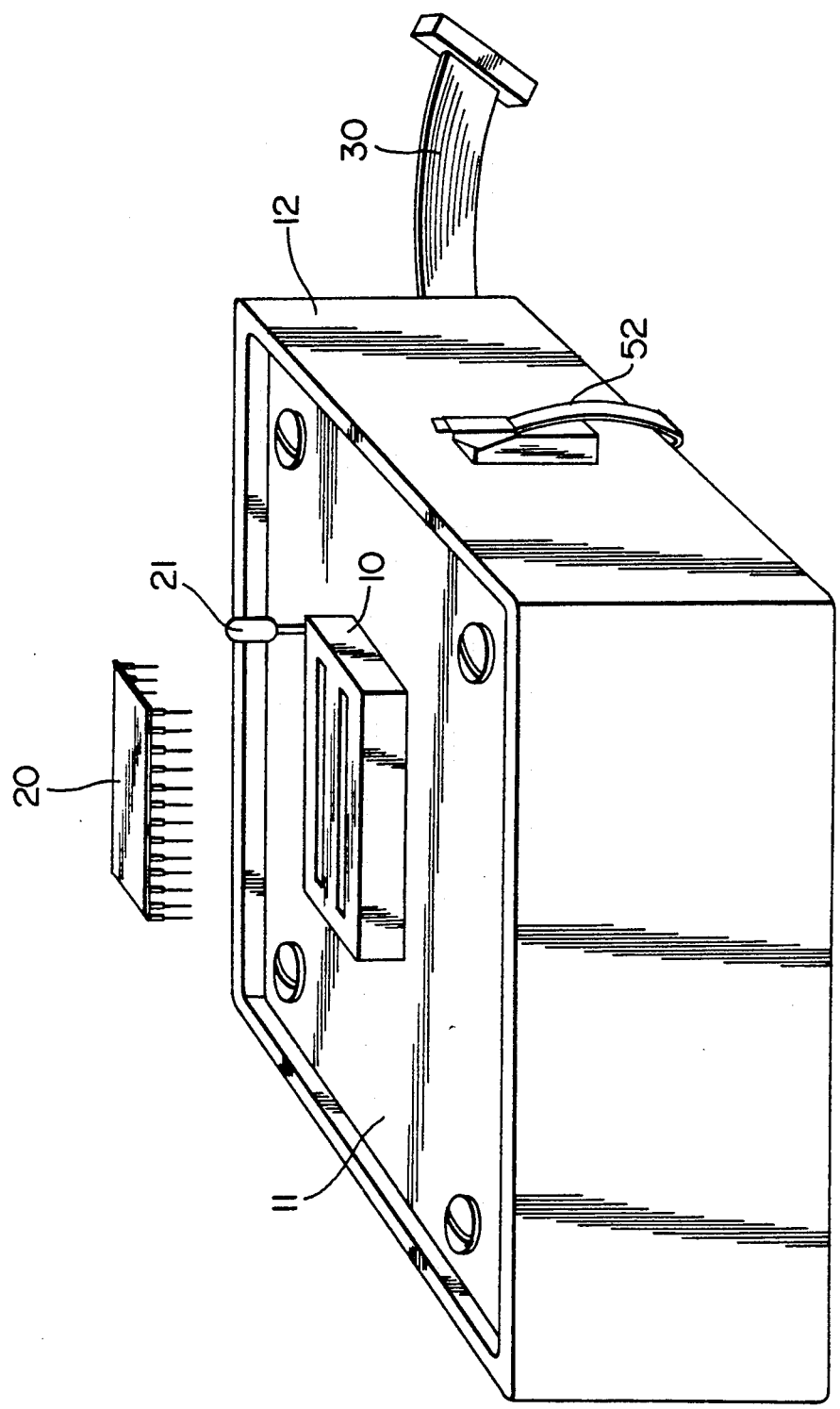
FIG. 4 is a perspective view from above of a removable assembly of the instrument.

Referring to the drawings, and initially to FIGS. 1 to 4, there is illustrated a temperature control instrument for electronic components under test, indicated generally by the reference numeral 1. The control instrument 1 is of portable, stand-alone construction and comprises a rectangular box casing 2 housing a controller, incorporating instrument control circuits, not shown, an input interface keypad 3 and an output interface liquid crystal display 4. The control instrument 1 also has an internal surface 6 formed by silicon seals 26 and a component recess 8 surrounding the active face 9 of a thermoelectric device, in this case a set of three back-to-back Peltier cells 50 connected, at their other end, namely at the reference face, to an air cooled heat sink 51. A Socket 10 is mounted on a mounting board 11 spring-mounted within an interchangeable open ended housing formed by a die-cast box 12 which is in turn releasably mounted on a door 13 by catches 52. The door 13 is arranged to initially pivot upwards to a vertical position spaced-apart from the casing 2 and to then move inwardly perpendicular to the active face 9 to form a thermal enclosure as illustrated in FIG. 3. The arrangement to achieve this is illustrated in FIGS. 5 and 6 described in detail below.

The socket 10 is for reception of integrated circuits (IC's) such as that shown and identified by the reference numeral 20 and includes a conventional pin locking mechanism operated by a lever 21 to allow a user to secure integrated circuit pins within the socket. The mounting board 11 is resiliently mounted on the base of the die-cast box 12 by outwardly biased mounting springs 22 and pillars 23. Components connected to the IC 20 are mounted on a circuit board 54 mounted on the pillars 23 below the mounting board 11. Foamed plastics insulating material 25 is inserted in the die-cast box 12. Electrical leads 30 for the socket 10 are connected through the rear side of the die-cast box 12 (see FIG. 4).

Figure 1:
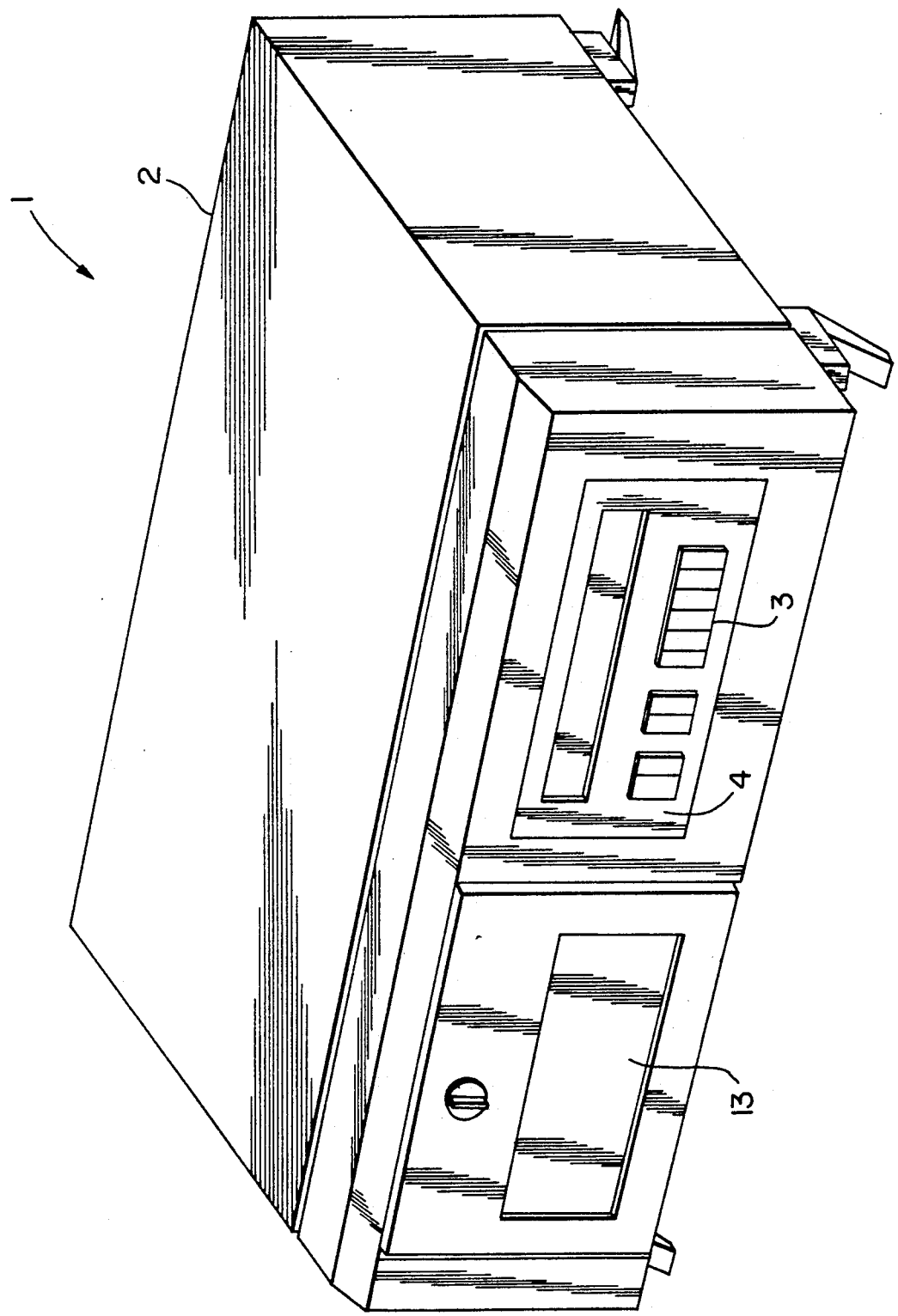
FIG. 1 is a perspective view from above of a temperature control instrument for electronic components under test according to the invention.
Figure 2:
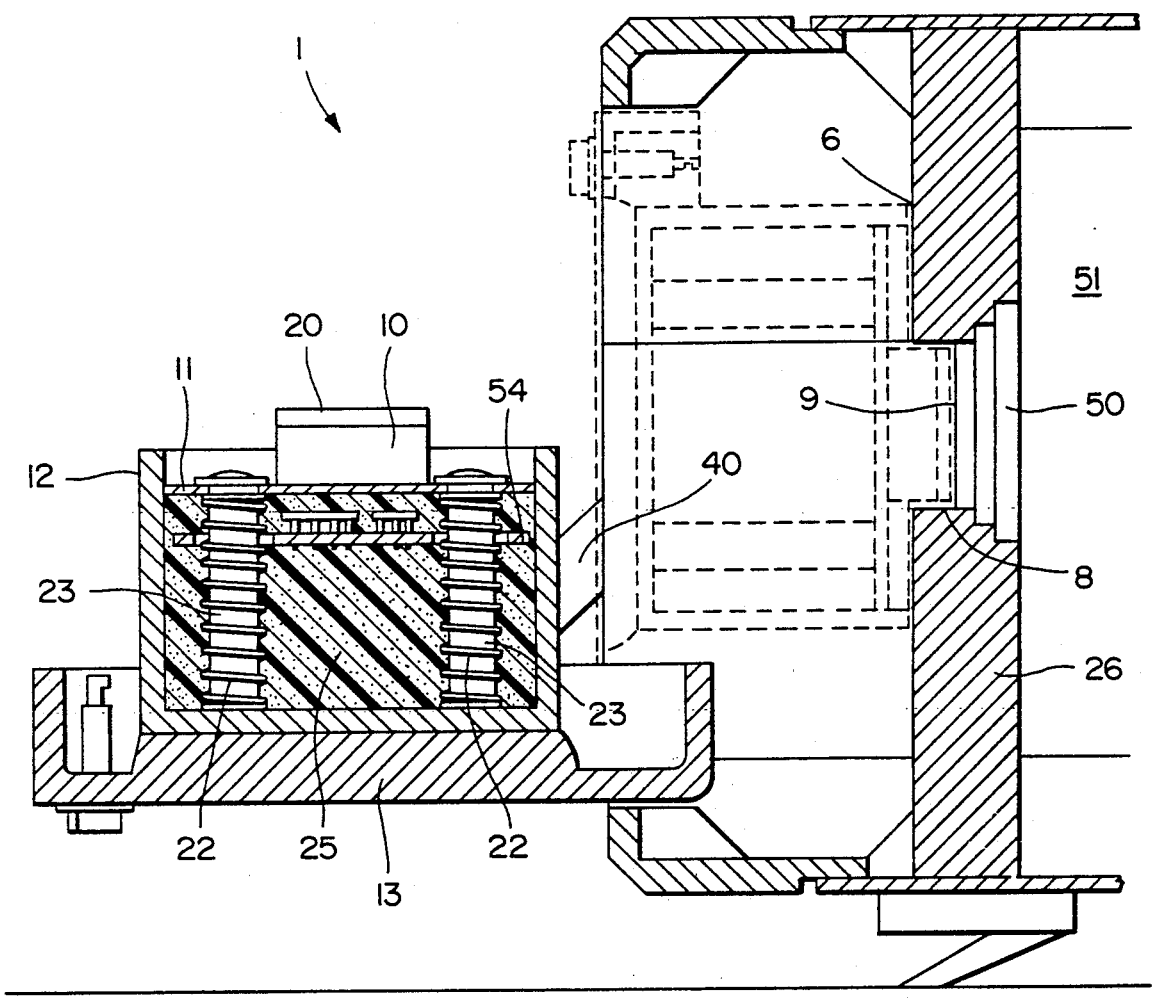
FIG. 2 is a cross-sectional side view of a portion of the instrument of FIG. 1 illustrating an enclosure in the open position.

In use, an integrated circuit to be tested is mounted in the socket 10 and the die-cast box 12 is clipped to the inside of the door 13 and the electrical leads 30 are then connected to a particular board, not shown, to be used in the testing of the integrated circuit 20. The required connections are made to the circuit board 54. The door 13 is then closed so that the integrated circuit 20 engages the active face 9 of the Peltier cells 50 within the recess 8. This closed position is illustrated in FIGS. 1 and 3. When in the closed position, the die-cast box 12 and the silicone seal 26 form a thermal insulating enclosure therebetween, within which the integrated circuit 20 directly contacts the Peltier cells 50. The keypad 3 is then used to control operation of the Peltier cells to provide whichever temperatures are required according to various tests to be carried out. When the door 13 is open, the Peltier cells 50 are heated slightly to prevent condensation of atmospheric moisture on the component under test. This is automatically carried out as a sensor (not shown) detects opening of the door.

It will further be appreciated that by using a die-cast box such as the box 12, manufacturing costs are reduced and the assembly may be easily removed and inserted within the temperature control instrument 1. The ability to quickly interchange die-cast boxes facilitates testing of circuits of different shapes and sizes with a minimum delay time between tests. The die-cast box 12 (which may be) also provides excellent electrical screening during tests. As the device 1 incorporates a linear regulator type power supply and the control circuits are located as far as possible from the enclosure, electrical noise is further reduced.

Figure 5A:
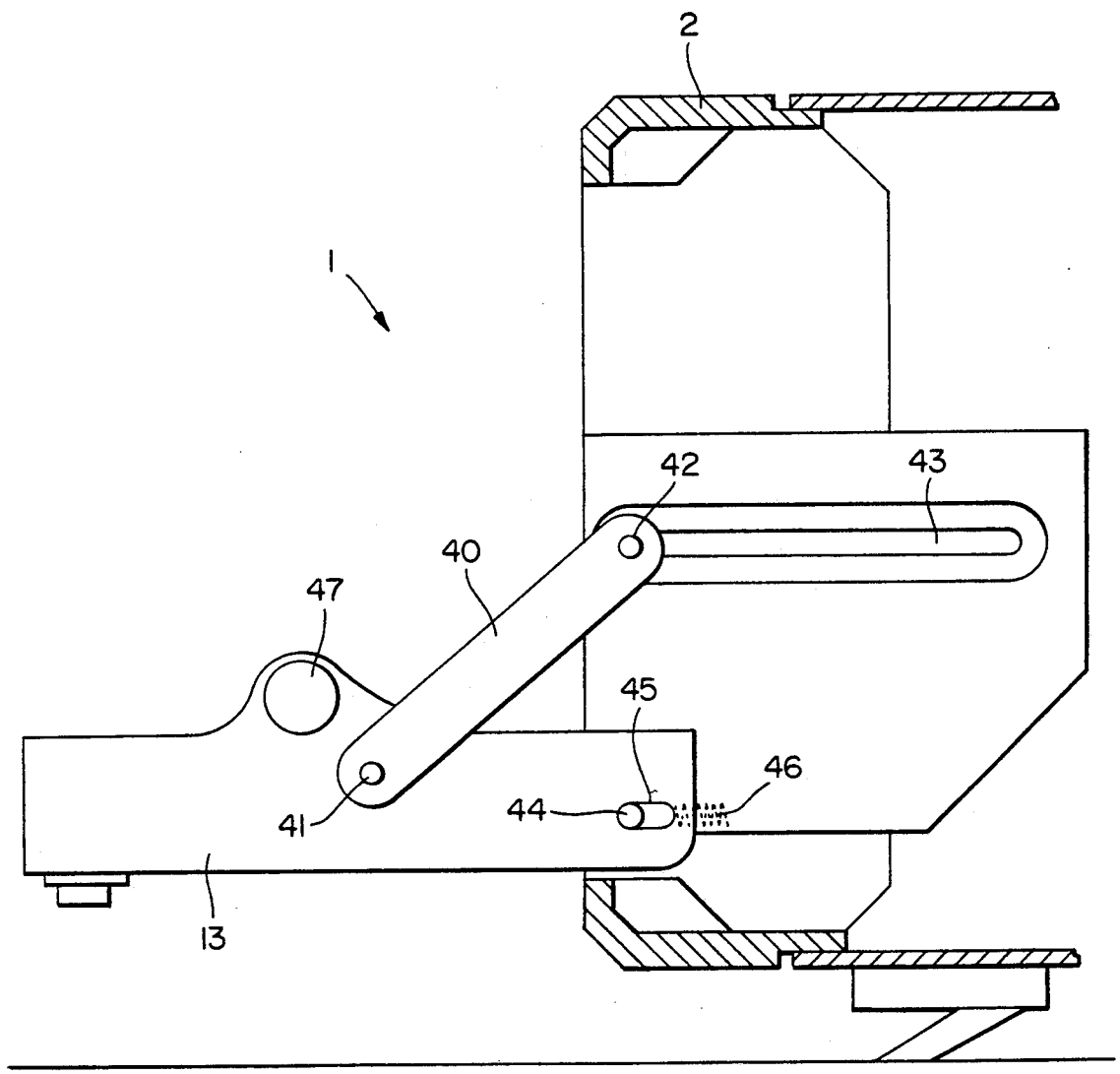
FIGS. 5(a) and 5(b) are diagrammatic side views illustrating portions of the instrument in more detail.
Figure 5B:
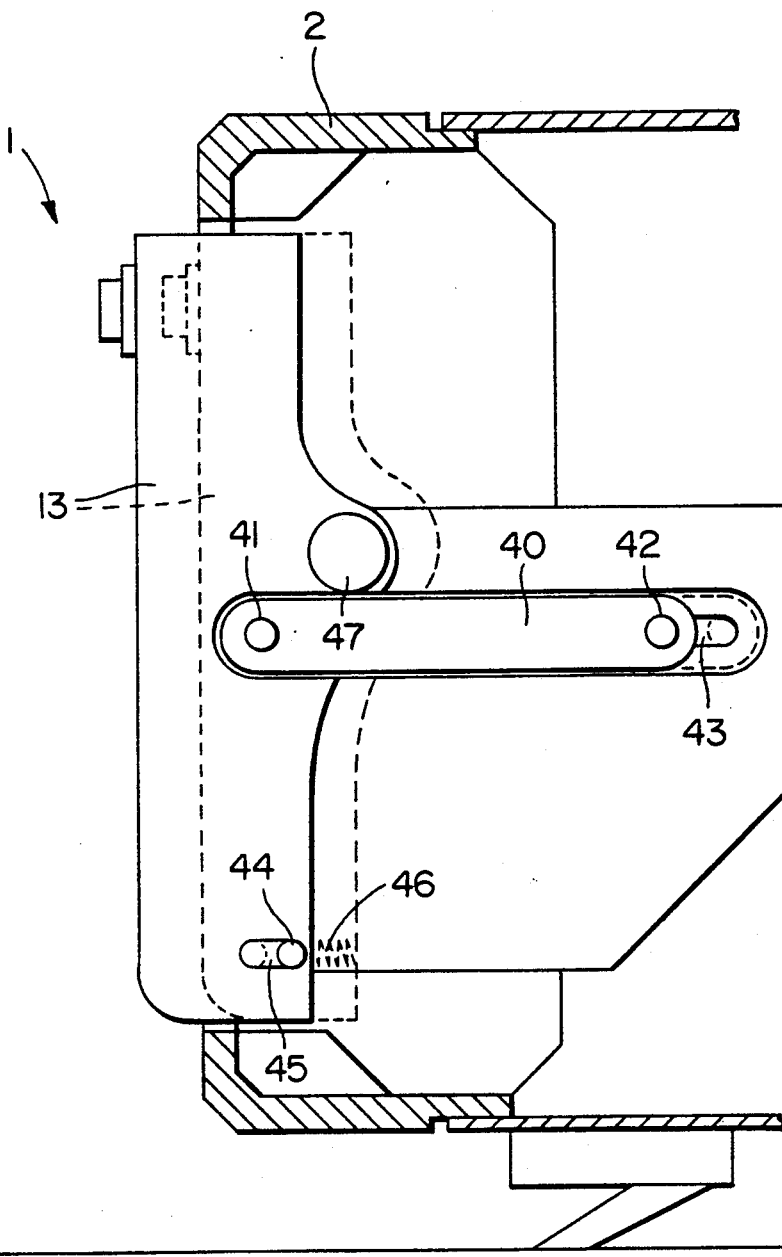
Figure 6:
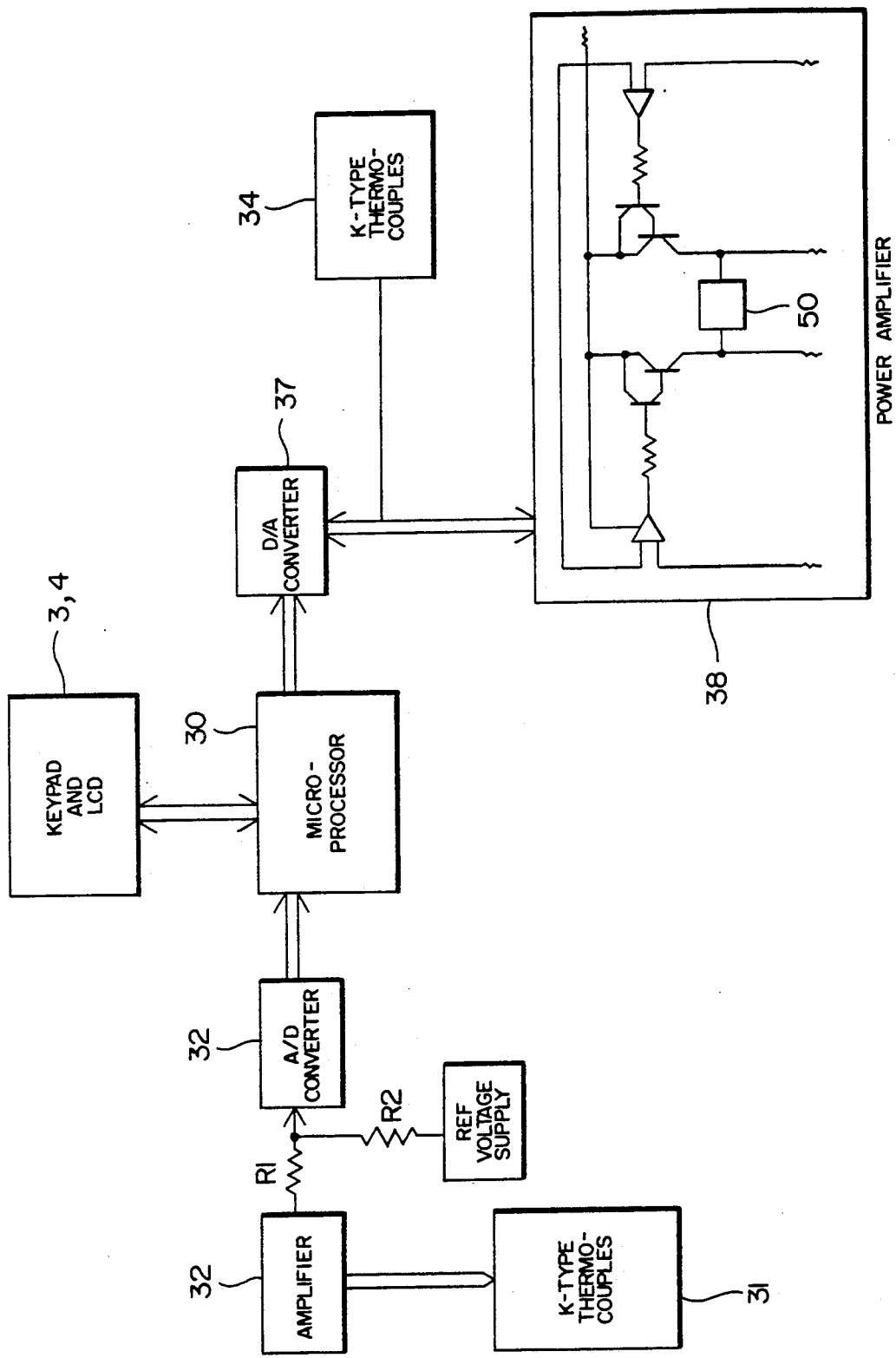
FIG. 6 is a block diagram illustrating operation of a portion of the instrument.

Referring now to FIGS. 5(a) and 5(b), the operating mechanism for the door 13 is illustrated in more detail. Like parts are assigned the same reference numerals. The door 13 is connected to the casing 2 by a stay 40, which is pivoted at one end to an upper pin 41 in the door 13 and at the other end to a movable pin 42 mounted within an upper guide slot 43 in the casing 2. The door 13 includes another, lower fixed pin 44 engaging a lower lateral slot 45 in the casing 2. The lower pin 44 is biased outwardly by a spring 46 connected to the casing 2. The door 13 further comprises a stop 47 above the upper pin 41.

In the open position, the spring 46 pushes the lower pin 44 outwardly against the outer end of the lower slot 45. As the door 13 is pushed upwards the stay 40 moves inwardly in the slot 43 and when in the vertical position the door 13 cannot pivot further around the upper pin 41 due to the action of the stop 47 (See FIG. 5(b)). At this stage, the door 13 is still spaced-apart and to form the enclosure, the door 13 is pushed inwardly against the action of the spring 46. In this way, contact between the component under test and the active face of the thermoelectric device is made evenly thus giving a good engagement for heat conduction and preventing scuffing.

Referring now to FIG. 6, the operation of the control circuit of the device 1 is illustrated in block diagram form. Like parts are assigned the same reference numerals. A microprocessor 30 controls the operation of the control circuits. K-type thermocouples 31 are mounted at the socket 10 for sensing the temperature of a component under a test. The thermocouples 31 are connected to an associated amplifier 32 which is in turn connected to an analogue to digital converter, in this case, a voltage to frequency (V/F) converter 33. The V/F converter 33 is connected to a counter in the microprocessor 30. The microprocessor 30 is connected at its output to a digital to analogue (D/A) converter 37, which is in turn connected to a power amplifier 38 for the Peltier cells 50. A separate, independent protection circuit 34 comprising K-type thermocouples for detecting the temperature of the heat sink and Peltier cell active face is also provided.

In operation, the V/F converter 33 is operated with an offset frequency of approximately 20 kHz so that a zero voltage input gives a count of approximately 8000 cycles in a 400 millisecond counting period. This offset is provided so that negative input voltages to the V/F converter do not result in zero or negative frequency output. The thermocouple amplifier 32 is connected to the V/F converter 33 via parallel resistors R1 and R2, R2 being connected to a reference voltage supply. The microprocessor 30 is programmed to allow for inaccuracies in the values of R1 and R2 by subtracting a frequency value corresponding to the value obtained when the analogue input to the V/F converter 33 is zero. Needless to say, the microprocessor 30 is also programmed to allow for non-linearities in thermocouple output. As the power amplifier 38 is arranged to supply current in either direction, the distortion caused in switching over of separate supplies is avoided.

The microprocessor 30 drives the Peltier cells 50 with the maximum permitted current if the difference between the actual temperature and the desired temperature is more than 12° C. The maximum current value used for cooling is different from that used for heating because the Peltier cells 50 behave differently for heating and cooling.

The independent protection circuit 34 acts to cut-out operation of the device 1 in the event of temperature extremes being detected at the heat sink or Peltier cell active face. Such extremes can be caused, for example, by the absence of a component with the device switched on. It will be appreciated that this is an important feature as Peltier cells may be easily damaged by temperature extremes.

The microprocessor 30 includes an IEEE-488 computer interface to allow the testing device 1 to be controlled by a remote computer if desired. Various control constants such as gain constants and addresses are stored in nonvolatile memory in the microprocessor 30. These constants can be changed by a user via the keypad 3 when it is desired to calibrate the instrument 1. Alternatively, the constants may be changed through the IEEE-488 computer interface. It will be appreciated that this facility allows the instrument to be automatically calibrated for accuracy and to have different control constants for different sizes of components under test. It also provides for self-tuning either by a user or by a remote computer. A user may tune the instrument by noting the mean maximum actual temperature swings from the target temperature for a component under test and the mean time period for these swings and then inputting those valves via the keypad 3. To avoid electrical noise, changes over a period of a few seconds in the output value of the D/A converter 37 are prevented.

The liquid crystal display 4 displays actual temperature and the target temperature for a component under test and also the elapsed time since the last change in desired temperature. Error messages are also displayed.

It will be appreciated that the instrument 1 need not necessarily be used as a stand-alone unit as the microprocessor 30 may be connected by an IEEE-488 interface to a remote computer for forming an automatic test facility and further, an operator can control the complete test facility from the front panel of the testing device 1.

As the thermoelectric device is used for heating and cooling, the instrument 1 is only a fraction of the size of presently known thermal control apparatus. There is no need for refrigeration units or gas storage cylinders. As its' construction is extremely simple, the control instrument of the invention is more reliable than known thermal control instruments and requires little maintenance. It is envisaged that both the cost of manufacturing and the maintenance costs will be much lower than heretofore. Another advantage of this construction of thermal testing device is that very little acoustic noise is produced. This is in contrast to presently known thermal testing devices, the refrigeration units of which generate excessive noise and, indeed, a special room is often required to house them. As a component under test is in direct contact with the Peltier cells and there is a relatively small thermal enclosure, excellent temperature control within a tolerance range of + or −0.1° C. has been achieved. A further, advantage is that circuits associated with a component under test may be located closely thereto without being subject to temperature extremes.

As current through the Peltier cells is varied gradually, the problems caused in Peltier cells by sudden voltage changes are avoided. Further, by maintaining a constant current level in the Peltier cells, electrical noise is avoided. It will be appreciated that these are significant advantages.

The instrument of the invention may include a cold accumulator. Such an accumulator would consist of a piece of metal which is cooled over a relatively long time period by the Peltier cell. When a rapid reduction in temperature is required, air from the enclosure may be passed over the accumulator and back into the enclosure.

It is envisaged that the control circuit may include a switching regulator for supplying the Peltier Cells with current switching at a very high frequency to control temperature. The advantage of this arrangement is that damage to the Peltier Cells is avoided. It is also envisaged that Peltier cell current may be maintained in direct protection to cold face temperature to obtain maximum efficiency.

As the thermoelectric device is used for both heating and cooling, the base temperature from which the instrument operates may be taken as the middle of the desired operating range. Instead of the arrangement illustrated, it is envisaged that a separate heating element may be used for heating the enclosure, the thermoelectric device being used only for cooling. In this case, it may not be convenient to operate from a base temperature in the middle of the range. Needless to say, the heat sink may be cooled by air or a water or any other means.

We claim:

1. A temperature control instrument for an electronic component under test comprising:
   a body;
   a testing enclosure in said body for the component;
   a socket means mounted within said testing enclosure for the reception of the component;
   a thermoelectric device for heating or cooling said enclosure, said thermoelectric device having a heat transfer active face and and a reference face, said reference face being maintained at a substantially constant temperature, and a controller comprising a control circuit for controlling operation of the thermoelectric device by varying the magnitude and direction of current applied to the thermoelectric device to alter the temperature of said active face;
   a mounting assembly for mounting said socket means and thermoelectric device separately and relatively movable with respect to each other between a closed position in which said active face is in contact with the electronic component and an open position in which said active face and component are spaced apart; and
   temperature sensing means operatively connected to said controller for sensing temperature within the enclosure.

2. A temperature control instrument as recited in claim 1 wherein said relative movement between said socket means and said thermoelectric device comprises movement substantially perpendicular to said active face.

3. A temperature control instrument as recited in claim 1 wherein said socket means is mounted in a removable housing within said enclosure.

4. A temperature control instrument as recited in claim 3 wherein said socket means is spring mounted within said housing so that, in use, a component in the socket means is urged against the active face of the thermoelectric device.

5. A temperature control instrument as recited in claim 3, wherein said active face of said thermoelectric device forms part of an internal surface of the instrument and said housing has upstanding walls for contacting said internal surface in the closed position to surround said active face of said thermoelectric device and form said test enclosure.

6. A temperature control instrument as recited in claim 3 wherein said housing includes means for supporting circuits separate from said test enclosure for connection to a component under test.

7. A temperature control instrument as recited in claim 3 and further comprising a door on the instrument, said housing being mounted on said door.

8. A temperature control instrument as claimed in claim 7 wherein:

said door is mounted on a pivot hinge spring urged away from said active face of said thermoelectric device;

a stay is pivotally mounted adjacent one end thereof on said door and pivotally and slidably mounted adjacent the other end thereof on longitudinal guide means for movement substantially perpendicular to said active face; and stop means is provided on the instrument for preventing further pivotal movement of said stay when, on closing the door, the door has reached a position substantially parallel to said active face, closure of the door being completed by pushing the door substantially perpendicularly inwards towards said active face.

9. A temperature control instrument as recited in claim 1 wherein:

a door is provided for said enclosure;

sensor means is connected to said controller for detecting opening of said door; and said controller further comprises means for heating said active face of said thermoelectric device in response to said sensor means on opening of said door.

10. A temperature control instrument as recited in claim 1, wherein said temperature sensing means includes a temperature sensor mounted on said socket means.

* * * * *